United States Patent
Moholt et al.

(10) Patent No.: US 7,741,589 B2
(45) Date of Patent: Jun. 22, 2010

(54) METHOD AND APPARATUS PROVIDING MULTIPLE TRANSFER GATE CONTROL LINES PER PIXEL FOR AUTOMATIC EXPOSURE CONTROL

(75) Inventors: Jorgen Moholt, Moss (NO); Sohrab Yaghmai, Oslo (NO)

(73) Assignee: Micron Technology, Inc., Boise, ID (US)

( * ) Notice: Subject to any disclaimer, the term of this patent is extended or adjusted under 35 U.S.C. 154(b) by 58 days.

(21) Appl. No.: 11/417,160

(22) Filed: May 4, 2006

(65) Prior Publication Data

US 2007/0257183 A1    Nov. 8, 2007

(51) Int. Cl.
*H01L 27/00*    (2006.01)
*H01L 31/00*    (2006.01)

(52) U.S. Cl. .................. 250/208.1; 250/214.1
(58) Field of Classification Search .............. 250/208.1, 250/214 R, 214.1, 214 DC; 348/294–324, 348/272, 273, 280–283; 257/290–293
See application file for complete search history.

(56) References Cited

U.S. PATENT DOCUMENTS

| | | | |
|---|---|---|---|
| 5,781,233 A | * | 7/1998 | Liang et al. ............. 348/302 |
| 7,038,820 B1 | * | 5/2006 | Kindt et al. ............. 358/474 |
| 2004/0051802 A1 | * | 3/2004 | Krymski .................. 348/308 |
| 2005/0151866 A1 | * | 7/2005 | Ando et al. .............. 348/297 |
| 2006/0138489 A1 | * | 6/2006 | Ahn et al. ................ 257/292 |
| 2006/0139470 A1 | * | 6/2006 | McGowan ............... 348/294 |

OTHER PUBLICATIONS

Bedabrata Pain et al., Imager With Motion-Artifact Suppression and Antiblooming, Nasa's Jet Propulsion Laboratory, www.nasatech.com/Briefs/Nov00/NPO20555.html.

* cited by examiner

*Primary Examiner*—Georgia Y Epps
*Assistant Examiner*—Pascal M Bui-Pho
(74) *Attorney, Agent, or Firm*—Dickstein Shapiro LLP

(57) ABSTRACT

An imager device includes a pixel array having some pixels providing output signals for automatic light control with other pixels providing image output signals. Multiple pixel cells of the array may be arranged to obtain sample data indicating the amount of light reaching the array, while image pixels in the array provide captured image data. An exemplary device includes a CMOS pixel array having 4T pixels arranged in rows and columns and having two transfer transistor control lines for each row of the array. Operation of the first transfer transistor line controls the pixels used for ALC operation while operation of the second transfer transistor line controls the pixels used for image capture.

31 Claims, 9 Drawing Sheets

METHOD AND APPARATUS PROVIDING MULTIPLE TRANSFER GATE CONTROL LINES PER PIXEL FOR AUTOMATIC EXPOSURE CONTROL

FIELD OF THE INVENTION

The invention relates generally to imaging devices and more particularly to a pixel array providing for automatic exposure control in an imaging device.

BACKGROUND OF THE INVENTION

CMOS imagers are becoming increasingly popular for imager applications. A CMOS imager circuit includes a focal plane array of pixel cells, each one of the cells including a photosensor, for example, a photogate, photoconductor or a photodiode overlying a substrate for accumulating photo-generated charge in the underlying portion of the substrate. Each pixel cell has a readout circuit that includes at least one output transistor formed in the substrate and a charge storage region formed on the substrate connected to the gate of an output transistor. The charge storage region may be constructed as a floating diffusion region.

In a CMOS imager, the active elements of a pixel cell perform the necessary functions of: (1) photon to charge conversion; (2) accumulation of image charge; (3) transfer of accumulated charge to a storage region, typically operated as a floating diffusion region; (4) resetting the storage region to a known state; (5) selection of a pixel for readout; and (6) output and amplification of one signal representing the reset storage region and other signal representing accumulated pixel charge. The charge at the storage region is typically converted to a pixel output voltage by the capacitance of the storage region and a source follower output transistor which has a gate coupled to a storage region.

CMOS imagers of the type discussed above are generally known as discussed, for example, in U.S. Pat. No. 6,140,630, U.S. Pat. No. 6,376,868, U.S. Pat. No. 6,310,366, U.S. Pat. No. 6,326,652, U.S. Pat. No. 6,204,524 and U.S. Pat. No. 6,333,205, assigned to Micron Technology, Inc., which are hereby incorporated by reference in their entirety.

FIG. 1 illustrates a simplified block diagram of an exemplary CMOS imager 10 which includes a pixel array 20 comprising a plurality of pixels arranged in a predetermined number of columns and rows. The pixels of each row in array 20 are all turned on at the same time by a row select line and the pixels of each column are selectively output onto a respective column output line. A plurality of row and column lines are provided for the entire array 20.

The row lines are selectively activated by a row driver 32 in response to row address decoder 30 and the column select lines are selectively activated by a column driver 36 in response to column address decoder 34. Thus, a row and column address is provided for each pixel. The CMOS imager 10 is operated by a timing and control circuit 40, which controls address decoders 30, 34 for selecting the appropriate row and column lines for pixel readout, and row and column driver circuitry 32, 36, which apply driving voltage to the drive transistors of the selected row and column lines.

Each column contains sampling capacitors and switches in a sample and hold (S/H) circuit 38 associated with the column driver 36. In operation, the sample and hold circuit 38 samples and holds a pixel reset signal $V_{rst}$ and a pixel image signal $V_{sig}$ for each selected pixel. A differential signal ($V_{rst} - V_{sig}$) is produced by differential amplifier 42 for each pixel. The signal is digitized by analog-to-digital converter 45 (ADC). The analog-to-digital converter 45 supplies the digitized pixel signals to an image processor 50, which forms a digital image output 52.

Typical CMOS imager pixels within array 20 have either a three transistor (3T) or four transistor (4T) design, though pixels having a larger number of transistors are also known. A 4T or higher "T" pixel may include at least one electronic device such as a transistor for transferring charge from a photosensor to the storage region and one device, also typically a transistor, for resetting the storage region to a predetermined charge level prior to charge transference.

A 3T pixel does not typically include a transistor for transferring charge from the photosensor to the storage region. A 3T pixel typically contains a photo-conversion device for supplying photo-generated charge to the storage region; a reset transistor for resetting the storage region; a source follower transistor having a gate connected to the storage region, for producing an output signal; and a row select transistor for selectively connecting the source follower transistor to a column line of a pixel array. In a 3T pixel cell, the charge accumulated by a photo-conversion device may be read out prior to resetting the device to a predetermined voltage. It has been suggested that 3T pixel cells could be utilized to support automatic light control (ALC) operations, also referred to as automatic exposure control. ALC is used to control the amount of light integrated by a pixel cell. ALC operations may determine, among other things, a time for charge readout based on the amount of charge generated by the photo-conversion device and may adjust the image integration time and thus the amount of charge further generated by the photo-conversion device in response to the charge present on the photo-conversion device at a particular time.

Although the 3T design (or 4T pixel operated in a 3T mode) is useful to support ALC operations, the 4T pixel configuration is preferred over the 3T pixel configuration for readout operations because it reduces the number of "hot" pixels in an array (those that experience an unacceptably high dark current), and the 4T configuration diminishes the kTC noise that 3T pixels experience with the readout signals. For example, 4T pixels can be used for correlated double sampling, whereby the storage region, also termed herein as the floating diffusion region, begins at a predetermined reset voltage level by pulsing a reset transistor; thereafter, the reset voltage produced by the source follower transistor is read out through the row select transistor as a pixel reset signal $V_{rst}$. Then, integrated photo-generated charge from the photosensor is transferred to the floating diffusion region by operation of a transfer transistor and a pixel image signal $V_{sig}$ produced by the source follower transistor is read out through the row select transistor. The two values, $V_{rst}$ and $V_{sig}$, are subtracted thereby reducing common mode noise.

Since light conditions may change spatially and over time, automatic light control is an advantageous function, to ensure that the best image is obtained by controlling the image sensor's exposure to the light. In some imager applications, there is a need to use the present illumination during the actual exposure of an image in a current frame to control the exposure because the use of the imager's illumination in a prior frame may not be sufficient for the intended application. Further discussion on ALC and real-time exposure control may be found in U.S. patent application Ser. No. 10/846,513, filed on May 17, 2004; Ser. No. 11/052,217, filed on Feb. 8, 2005; and Ser. No. 10/806,412, filed on Mar. 22, 2004, each assigned to Micron Technology, Inc., and which are incorporated herein by reference.

Accordingly, there is a desire and need for an imaging device that has accurate exposure control and with low dark current and kT/C noise. Put another way, there is a need and desire for an imaging device that has both automated light control and correlated double sampling functionality.

BRIEF SUMMARY OF THE INVENTION

In various exemplary embodiments, the invention provides an imager with accurate exposure control with relatively low dark current and kT/C noise in a pixel array. The pixel array comprises a first set of pixels used for automatic light control and a second set of imaging pixels employing correlated double sampling for sensing an image. These embodiments allow monitoring of multiple pixel cells of the array to obtain sample data indicating the amount of light reaching the array, while allowing the imaging pixels to provide proper image data.

In exemplary embodiments, the invention includes a CMOS pixel array having e.g., 4T pixels arranged in rows and columns and having two transfer transistor control lines for each row of pixels. By operating one transfer transistor control line, the pixels used for ALC procedures are controlled, and, by operating the other transfer transistor control line, the pixels used for reproducing an image are controlled.

In one exemplary embodiment, signals from ALC pixels are read out several times within a short time period to determine an optimum exposure time for other pixels in the array. The ALC pixel signals can be read out, accumulated, and stored in memory. Use of the ALC pixels allows the imaging pixels to undergo a complete integration period while also obtaining the benefits of automatic exposure control.

In another exemplary embodiment, one of the dual transfer transistor signal lines can be disconnected for normal (non-ALC) operation of all pixels in a pixel array.

BRIEF DESCRIPTION OF THE DRAWINGS

The foregoing and other advantages and features of the invention will become more apparent from the detailed description of the exemplary embodiments provided below with reference to the accompanying drawings, in which.

DETAILED DESCRIPTION OF THE INVENTION

In the following detailed description, reference is made to the accompanying drawings, which form a part hereof and show by way of illustration specific exemplary embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The described progression of processing and operating steps exemplifies embodiments of the invention; however, the sequence of steps is not limited to that set forth herein and may be changed as is known in the art, with the exception of steps necessarily occurring in a certain order.

The terms "pixel" and "pixel cell," as used herein, refer to a photo-element unit cell containing a photo-conversion device and associated circuitry for converting photons to an electrical signal. The pixels discussed herein are illustrated and described with reference to using four transistor (4T) pixel circuits for imaging for the sake of example only. It should be understood that the invention may be used with respect to other imaging pixel arrangements having more (e.g., 5T, 6T) than four transistors or with pixel arrangements using devices other than transistors to provide output signals. Accordingly, in the following discussion it should be noted that whenever 4T pixels are discussed, pixels having additional transistors, used for example, for an anti-blooming, conversion gain adjustment, or shutter gate may be used.

Figure 5:
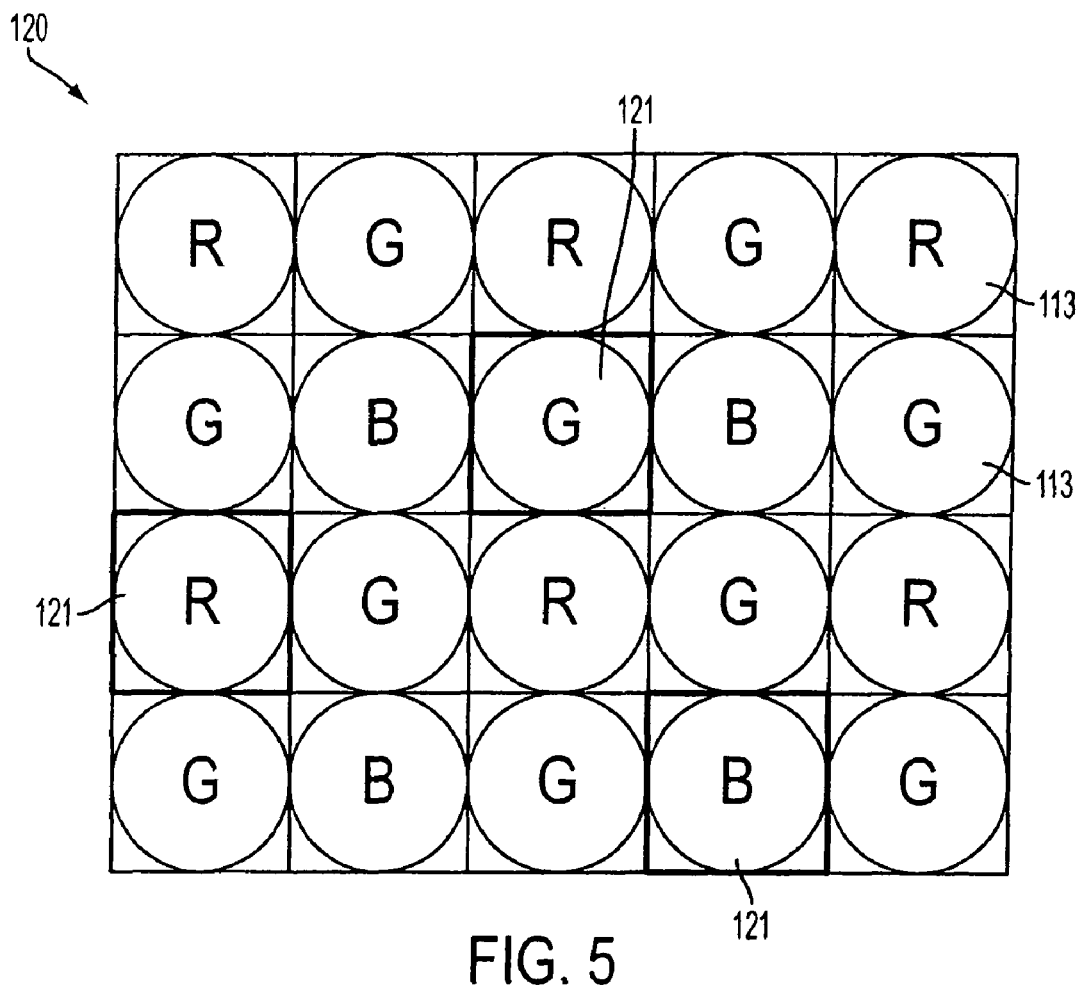
FIG. 5 is a plan view of a section of a pixel array constructed in accordance with an exemplary embodiment of the invention.

For purposes of illustration, a representative three-color R, G, B Bayer pattern pixel array is illustrated in FIG. 5 and described herein; however, the invention is not limited to the use of a Bayer pattern R, G, B array, and can be used with other color arrays, one example being C, M, Y, K (which represents cyan, magenta, yellow and black color filters). In addition, the invention can also be used in a mono-chromatic array where just one color is sensed by the array. Accordingly, the following detailed description is not to be taken in a limiting sense, and the scope of the present invention is defined not by the illustrative embodiments, but by the scope of the appended claims.

It should also be understood that, taken alone, a pixel does not distinguish one incoming color of light from another and its output signal represents only the intensity of light received, not any identification of color. For purposes of this disclosure, however, pixels will be referred to by color (i.e., "red pixel," "blue pixel," etc.) when a color filter is used in connection with the pixel to focus a particular wavelength of light, corresponding to a particular color, onto the pixel. For example, when the term "red pixel" is used herein, it is referring to a pixel with a red color filter that filters wavelengths of light within a wavelength range encountered at about 650 nm to the underlying pixel. Similar wavelength ranges exist for the "blue" and "green" pixels which are centered about a respective blue and green wavelength for each.

Figure 1:
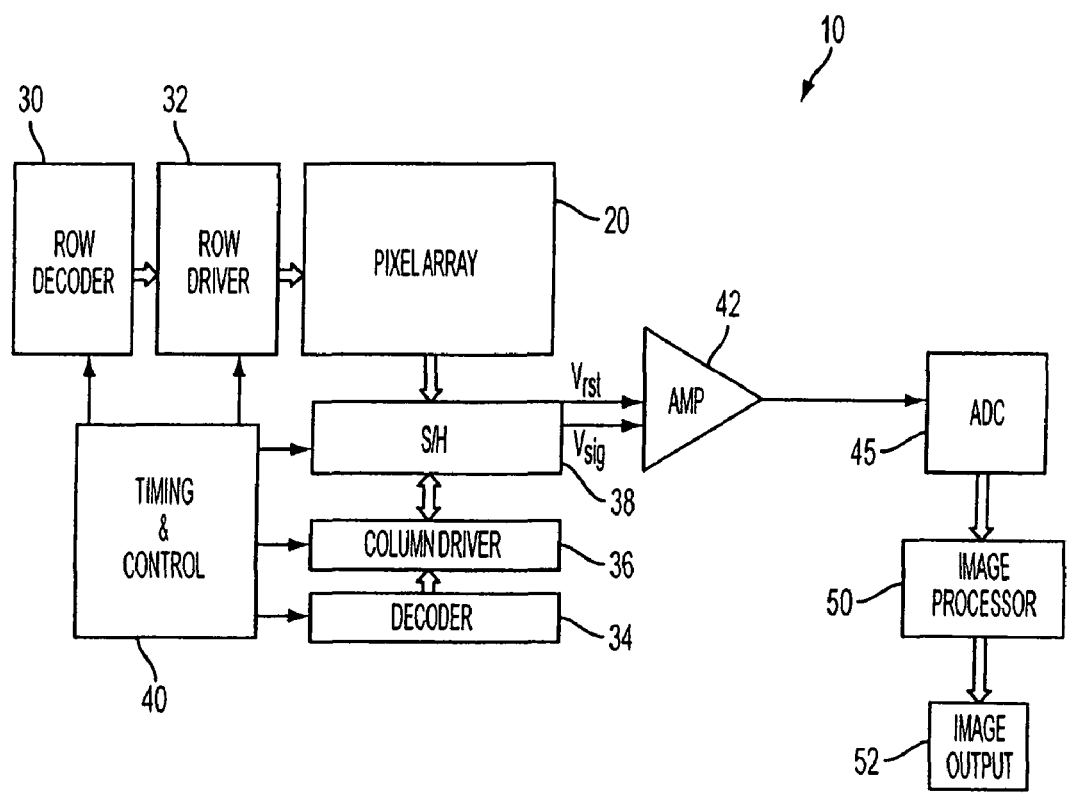
FIG. 1 is a block diagram of a conventional CMOS imager.
Figure 2:
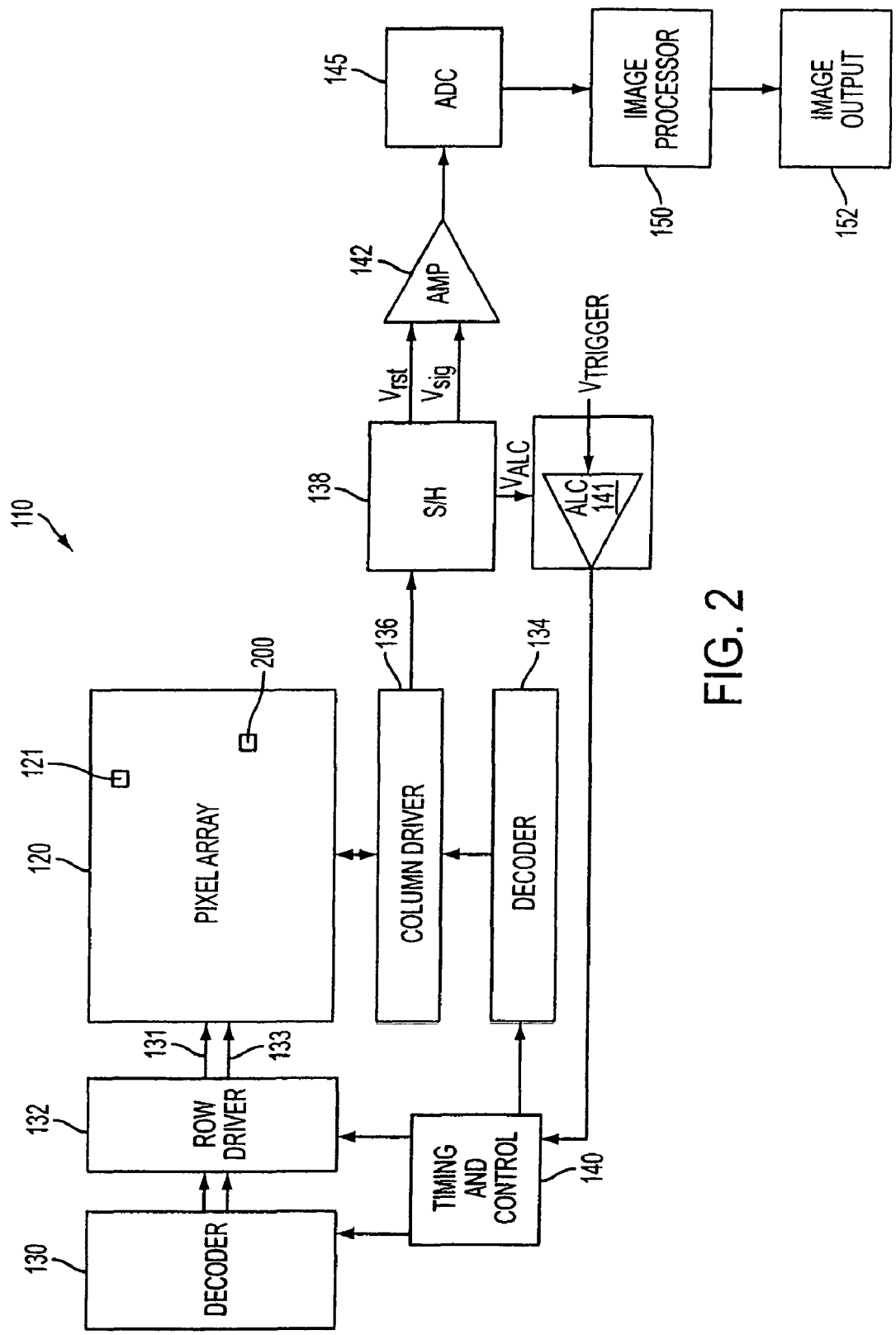
FIG. 2 is a block diagram of an exemplary imager constructed in accordance with an embodiment of the invention.

Referring now to the figures, where like reference numbers designate like elements, FIG. 2 shows an exemplary imager 110 having an automatic light control function constructed in accordance with an embodiment of the invention. The imager 110 includes a pixel array 120 (FIG. 3) containing several pixels 121 in the array 120 that are operated for automatic light control (ALC). Each row 113 of the pixel array 120 has two transfer transistor control lines 131, 133, for controlling via a transfer transistor 202, the transfer of charges from a photosensitive area (e.g., photodiode 201) to a charge storage region 210 for the pixels of the row 113. In accordance with another embodiment, only rows 113 of the array 120 that contain ALC pixels 121 would have two transfer control lines 131, 133.

The row lines are selectively activated by the row driver 132 in response to row address decoder 130. A column is also addressed and selected for pixel readout. Thus, a row and column address is provided for each pixel. The CMOS imager 110 is operated by the control circuit 140, which controls address decoders 130, 134 for selecting the appropriate row and column lines for pixel readout, and row and column driver circuitry 132, 136, which apply driving voltage to the drive transistors for the selected row and column lines.

Each column contains sampling capacitors and switches in a sample and hold (S/H) circuit 138 associated with the column driver 136 that samples and holds a pixel reset signal $V_{rst}$ and a pixel image signal $V_{sig}$ for selected pixels. A differential signal $(V_{rst}-V_{sig})$ is produced by differential amplifier 142. The differential signal is digitized by analog-to-digital converter 145 (ADC). The analog-to-digital converter 145 supplies the digitized pixel signals to an image processor 150, which forms a digital image output 152.

In addition, ALC circuitry 141 is used for providing automatic exposure control for the array 120. For example, signals $V_{ALC}$ representing charges accumulated are output from ALC pixels 121. These signals can be compared to an appropriate, predetermined level $V_{trigger}$, that represents an optimum signal for the array 120. When the output $V_{ALC}$ from the ALC pixels 121 is equal to the optimum signal $V_{trigger}$, the ALC circuitry 141 sends a signal to the timing and control circuitry 140, which stops image integration by imaging pixels 200, either immediately or after some preset time, and initiates readout from all imaging pixels 200 in the array 120. Other methods of operating the ALC circuitry 141 as known in the art or as described in U.S. application Ser. No. 10/806,412 assigned to Micron Technology, Inc., and herein incorporated by reference in its entirety, may also be utilized.

The ALC circuitry 141 may be operated on analog signals $V_{ALC}$ acquired from ALC pixels 121 which are compared to a set analog trigger voltage $V_{trigger}$ and may also include an amplifier such as a differential amplifier which changes an output when $V_{ALC}$ reaches or exceeds that value of $V_{trigger}$. Alternatively FIG. 2B shows exemplary ALC circuitry 141' that can be used in the imager 110 (FIG. 2). The ALC circuitry 141' may include an amplifier 180, analog to digital converter (ADC 182), and memory 184 such as a RAM memory, for accumulating, summing, and/or storing the ALC pixel signals $V_{ALC}$. The values in the memory 184 may be continuously monitored to set the overall exposure time for a captured frame. The exemplary ALC circuitry 141' can be used to increase the scan speed of the imager 110 by sampling the ALC pixels 121 in one row 113 while the ALC pixel signals $V_{ALC}$ in a previous row 113 are being converted by the ADC circuit 182 to digital values. Thereafter, a digital representation of the ALC pixel signal $V_{ALC}$ can be compared in the comparator 185 to a digital representation of the trigger voltage $V_{trigger}$.

Figure 3:
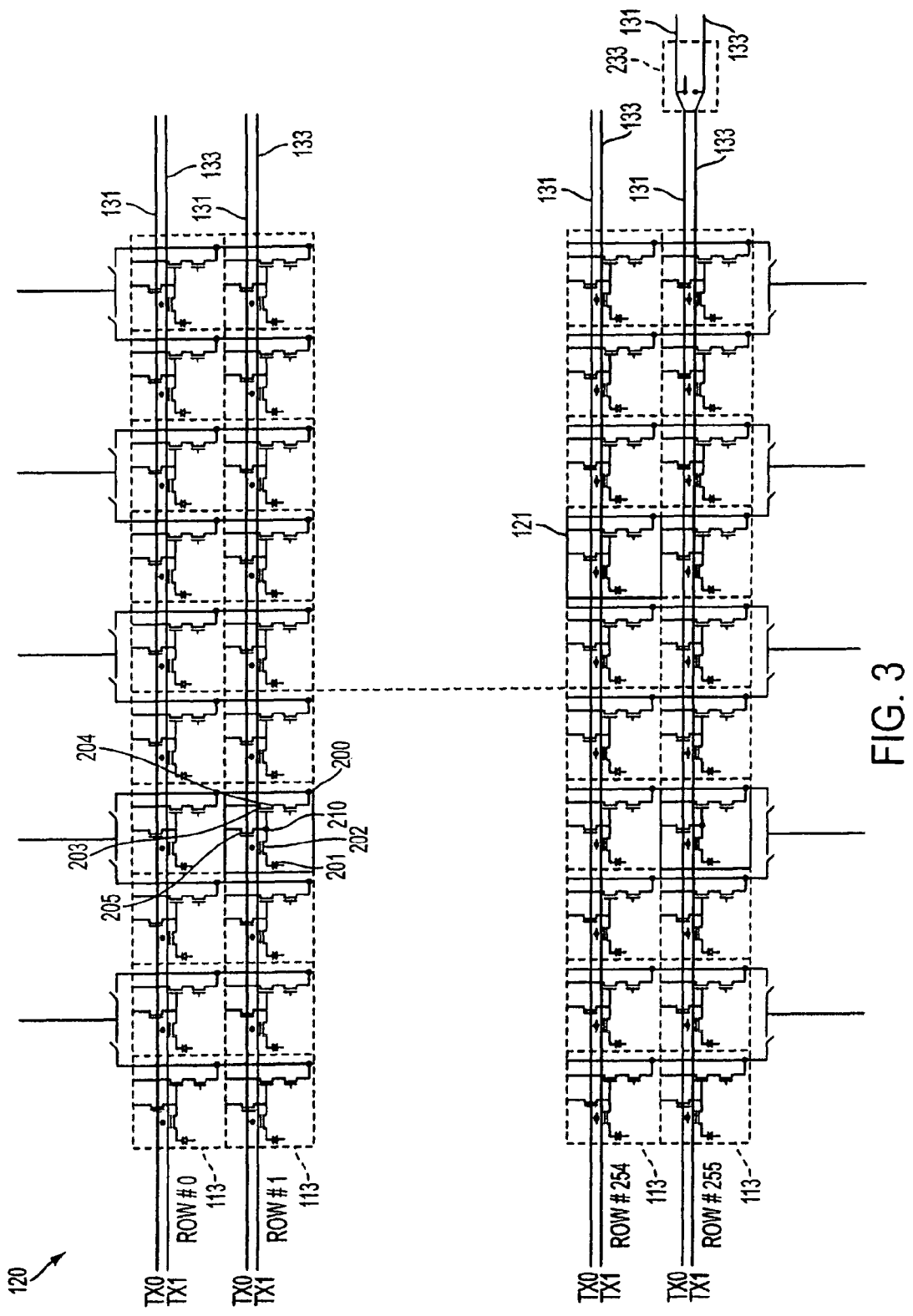
FIG. 3 is an electrical schematic diagram for a portion of a pixel array constructed in accordance with an exemplary embodiment of the invention.
Figure 3A:
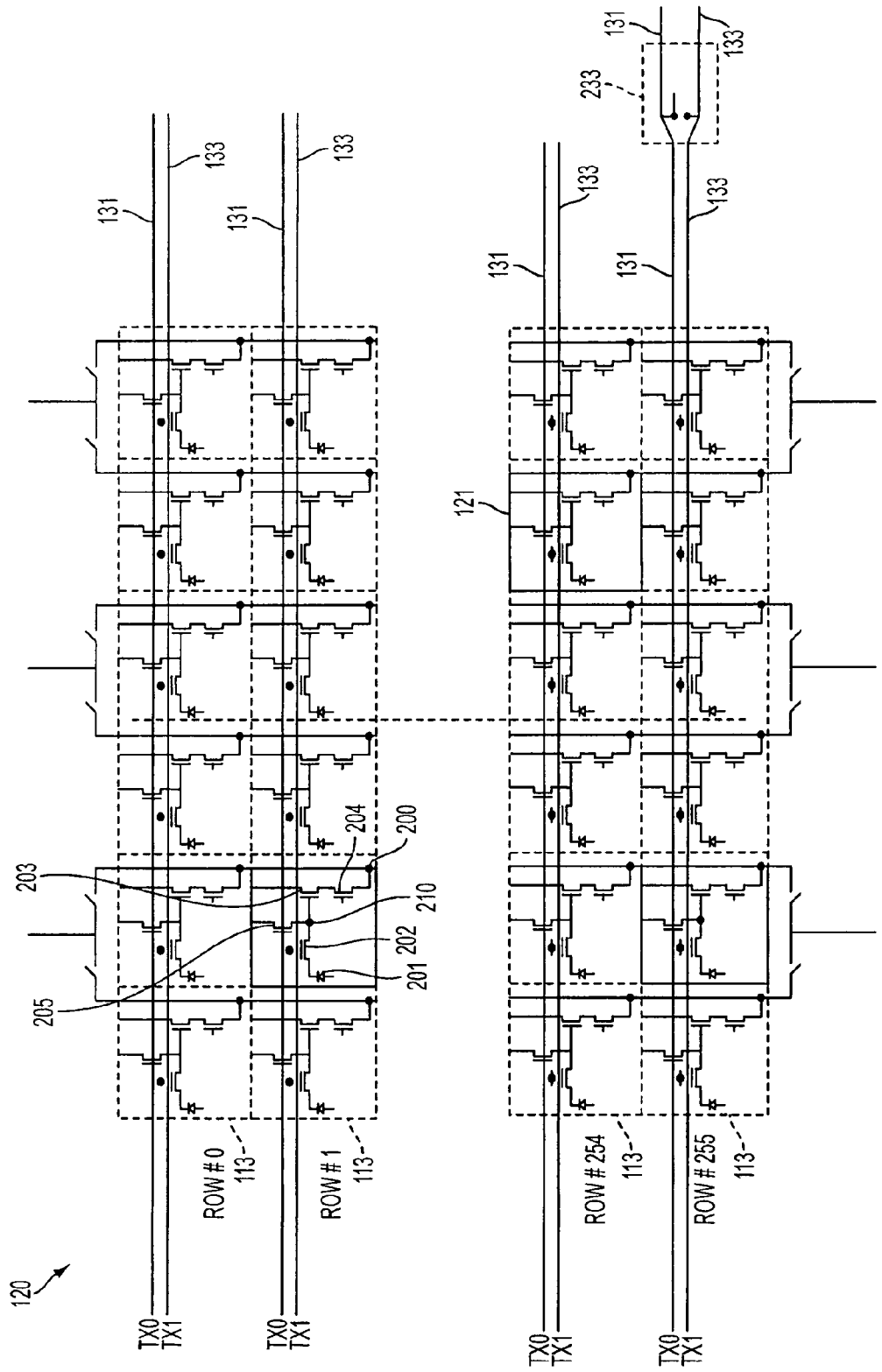
FIG. 3A is an electrical schematic diagram for one pixel as shown in FIG. 3.

Turning to FIG. 3, an exemplary embodiment of pixel array 120 is shown in schematic form as containing 256 rows 113 of imaging pixels 200. FIG. 3A shows, in electrical schematic format, an individual imaging pixel 200 in more detail. It should be understood that the ALC pixels 121 in the array have the same structure as the imaging pixels 200 as described below. The difference in the pixels 200, 121 is the method of operation and/or the application of signals to operate the structures in the pixels, as described with reference to FIG. 4. Therefore, the following discussion of the structure of pixel 200 is equally applicable to ALC pixels 121.

The illustrated pixels 200 are 4T pixels and include a photosensor, for example a photodiode 201, for generating electric charges (photocharges) in response to applied light. Alternatively, the pixels 200 may include a photogate, photoconductor or other photon-to-charge converting device, in lieu of a photodiode, as the initial accumulating area for photo-generated charge. Each pixel cell 200 has a transfer gate 202' of a transfer transistor 202 for transferring photocharges to a storage region (i.e., floating diffusion region 210). The floating diffusion region 210 is further connected to a gate 203' of a source follower transistor 203. The source follower transistor 203 provides an output signal to a row select access transistor 204 having a gate 204' for selectively gating the output signal to a column line. A reset transistor 205 having a gate 205' resets the floating diffusion region 210 to a specified charge level before each charge transfer from the photosensor 201.

As shown in FIG. 3, each row 113 of pixels in the array 120 is connected to two transfer transistor signal lines 131, 133. As shown in more detail in FIG. 3A, in accordance with one embodiment of the invention, each pixel 200 of the array has a transfer transistor gate 202' that is connected to the first transfer transistor signal line 131. Correspondingly, in this embodiment, each ALC pixel 121 would have a transfer transistor gate 202' connected to the second transfer transistor signal line 133. It should be understood that alternative arrangements are also within the scope of the invention, such as an arrangement where every transfer transistor gate 202' is selectively connected to a transfer transistor signal line 131, 133 by a switching mechanism. Thus, for each application of the imager 110, a processor could control which of the pixels in the array 120 are used for ALC functionality, by activating the switch to connect a transfer transistor gate 202' with the transfer transistor signal line 133. This alternative arrangement, however, would have increased cost of fabrication and decreased packing efficiency due to the increase wiring necessary.

Returning to FIG. 3, the first transfer transistor control line 131 is utilized when performing normal pixel signal readout operations (employing correlated double sampling) from imaging pixels 200 of the array. The second transfer transistor control line 133 is utilized when performing ALC operations for controlling a transfer transistor 202 for ALC pixels 121. With this arrangement, and as described in more detail below, it is possible to let most of the pixels 200 in the array integrate continuously for a specific time while the ALC pixels 121, controlled by the second transfer transistor control line 133, are read out and reset several times within a short time frame.

The two transfer transistor control lines 131, 133 are controlled by the row driver 132 (FIG. 2). In one exemplary embodiment, the two transfer transistor control lines 131, 133 can be detachably connected together to disable the ALC functionality and to operate the pixel array 120 using the conventional pixel readout operation. With reference to Row #255 in FIG. 3, a switch 233 is shown to connect the transfer transistor control lines 131, 133, such that all pixels in Row #255 would operate as imaging pixels 200. With a detachable connection, it is possible to switch between operating with and without ALC functionality. Specifically, the second transfer transistor control line 133 can be disconnected from the row driver 132 and instead is connected to the first transfer transistor control line 131 using a metal wire as a switch 233. Thus, with a carefully made layout it is possible to make two different functioning pixel array variations modifying only one metal mask.

Figure 2A:
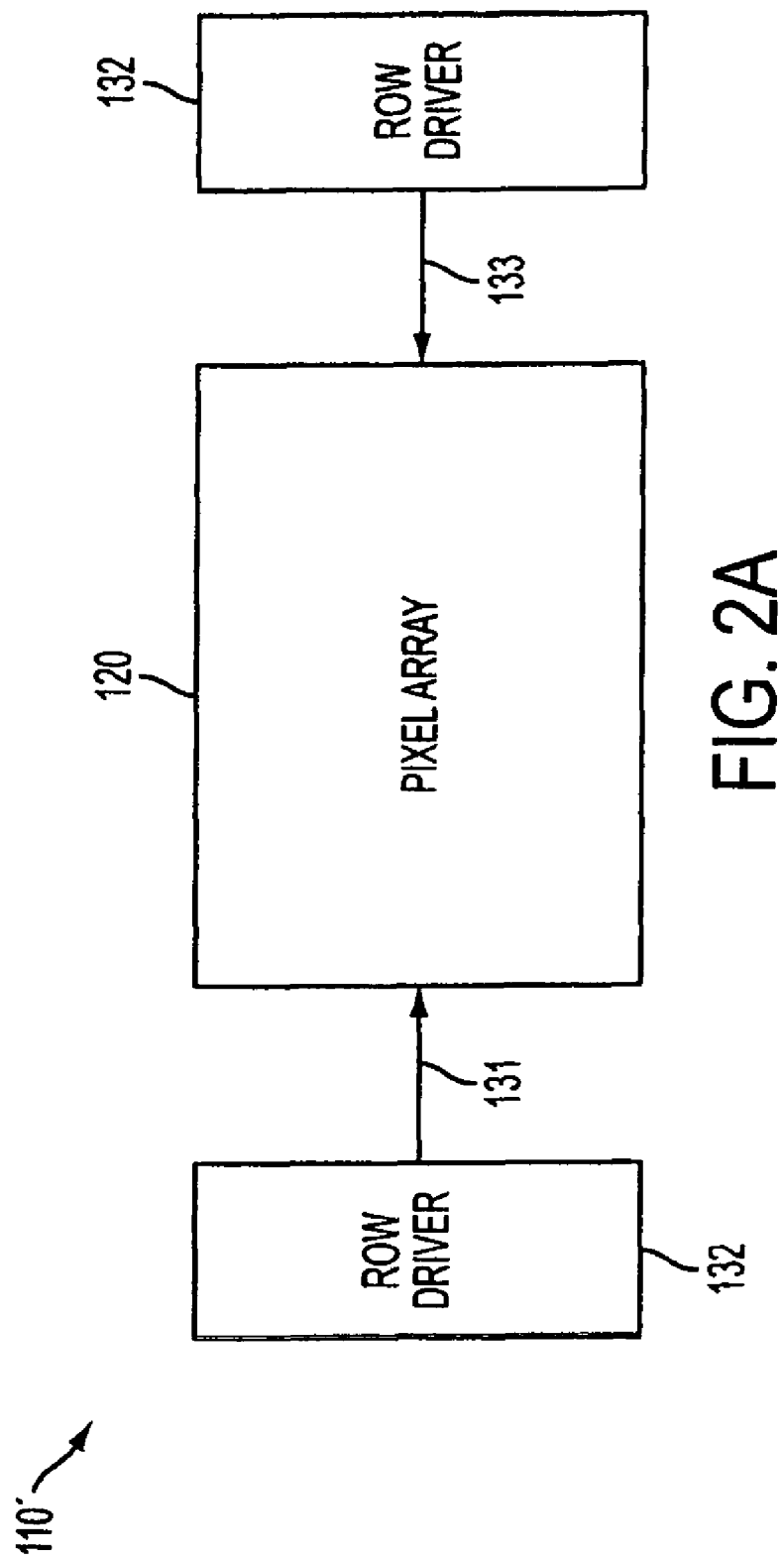
FIG. 2A is a partial block diagram of an exemplary imager constructed in accordance with an alternative embodiment of the invention.
Figure 2B:
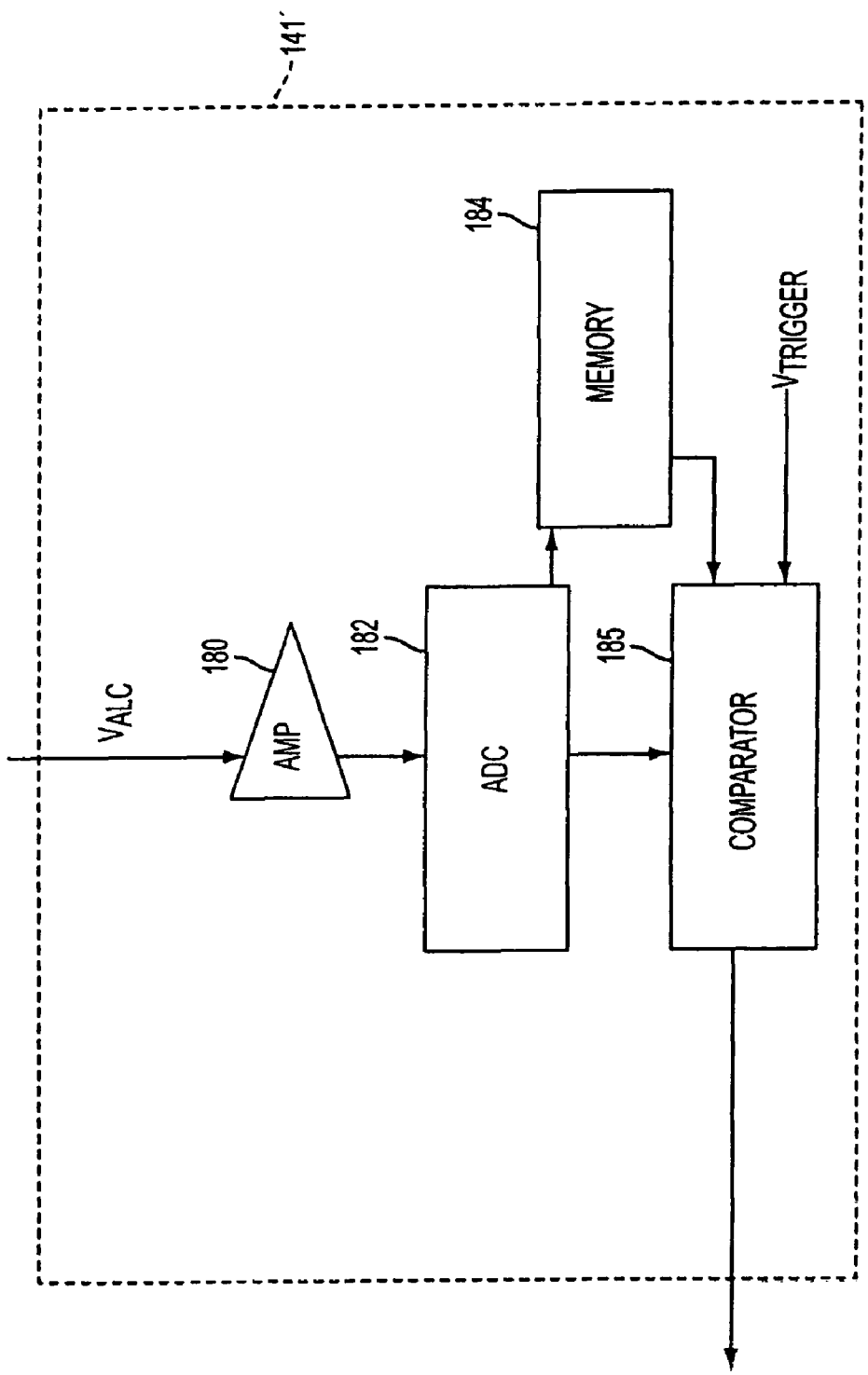
FIG. 2B is a partial block diagram of an exemplary automatic light control circuit constructed in accordance with an alternative embodiment of the invention.

As shown in FIG. 2A, in another embodiment, the two transfer transistor control lines 131, 133 may be operated by two respective drivers. Each of these two drivers may be identical to row driver 132 in FIG. 2. In this alternative embodiment, it would be preferable to put the two driver/ controllers 132 on opposite sides of the pixel array 120; however, it should be understood that the two row drivers could also be on one side of the pixel array 120. An imager 110' constructed as shown in FIG. 2A may have the remaining imager components as shown in FIG. 2 and as discussed in detail above. The two drivers 132 in imager 110' may or may not receive signals from the same timing and control circuitry 140.

Figure 4:
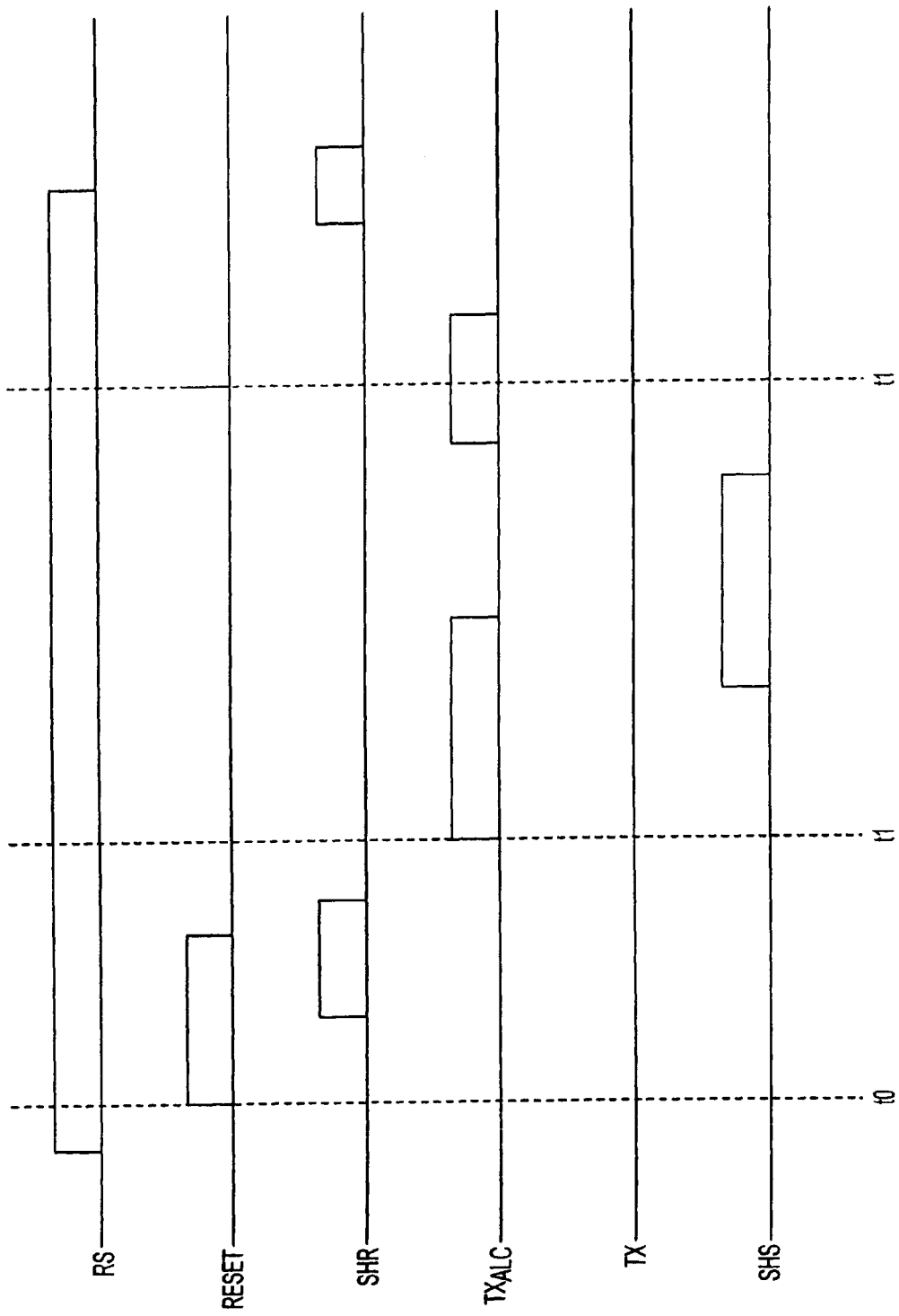
FIG. 4 is a timing diagram depicting an exemplary embodiment of a method of operating a pixel array in accordance with an exemplary embodiment of the invention.

Turning to FIG. 4, a first exemplary method of operating pixel array 120 is now described with further reference to FIG. 3. The method includes utilizing a first transfer transistor control line 131 for correlated double sampling pixel readout from imaging pixels 200 (FIG. 3) and utilizing a second transfer transistor control line 133 for performing ALC operations utilizing at least one ALC pixel 121. In the illustrated timing diagram shown in FIG. 4, only timing is shown for a row 113 of a pixel array 120 that has pixels 121 for performing ALC operations.

At an initial time, t0, every pixel in a row 113 (e.g., $Row_o$) is reset. As such, a common reset signal (Reset) is applied to activate reset transistors 205. This resets the respective floating diffusion regions 210. At approximately the same time, timing and control circuitry 140 (FIG. 2) causes a row select signal (RS) to be turned to high to activate row select transistors 206 to read out a reset signal $V_{rst}$ from all pixels in a row when the sample hold reset signal (SHR) is also turned high. This reset signal is read into an appropriate sample and hold circuit 138 until correlated double sampling is completed.

At a second time, time t1, a transfer transistor signal is applied to the second transfer transistor control line 133. A pixel signal $V_{ALC}$ is read out from the pixels 121 in $Row_o$ when the row select signal RS is turned to high, and the signal $V_{ALC}$ is sampled when the sample and hold signal SHS is applied. As stated above, this signal $V_{ALC}$ can be processed as an analog signal or as a digital signal which can be stored in ALC circuitry 141'. This ALC readout operation can be repeated one or more times before it is determined by ALC circuitry 141 that adequate exposure and/or optimum light conditions have been reached.

Finally, after time t1, the photosensor 201 is reset. Sometime after the sample and hold signal (SHS) is returned to low, the transfer transistor control line is reactivated by application of a high signal. At substantially the same time, a common reset signal (Reset) is applied to activate reset transistors 205 in the row. Thus, the photosensors 201 are reset. After this, a new exposure (integration period) starts.

It should be understood that the timing illustrated for an ALC row 113 of pixels would be similar to the timing utilized for rows containing non-ALC pixels 200 as well, except that the transfer transistor 202 is operated by applying a signal TX rather than $TX_{ALC}$ signals. Thus, the $TX_{ALC}$ signals are kept low. In the event that the ALC functionality is disconnected, only a signal TX is utilized to operate all transfer transistors 202 in the array. In this way, operation could be like a conventional 4T pixel array.

FIG. 5 shows a top-down portion of the pixel array 120 in accordance with one embodiment of the invention. As shown, the pixel array 120 may be used in connection with a Bayer pattern color filter array to replicate color images. As such, the ALC pixels 121 may include at least one of a red pixel R, a blue pixel B and a green pixel G. In addition, with reference to FIG. 2, each pixel color may have a different optimum pixel signal $V_{trigger}$ when performing ALC functions depending on the optimum conditions for each color. In this way, only when the outputs for ALC pixels 121 for each color pixel R, B, G reach the optimum pixel outputs (i.e., $V_{trigger}$), would the timing and control circuitry 140 initiate readout from the other pixels 200 array 120.

Figure 6:
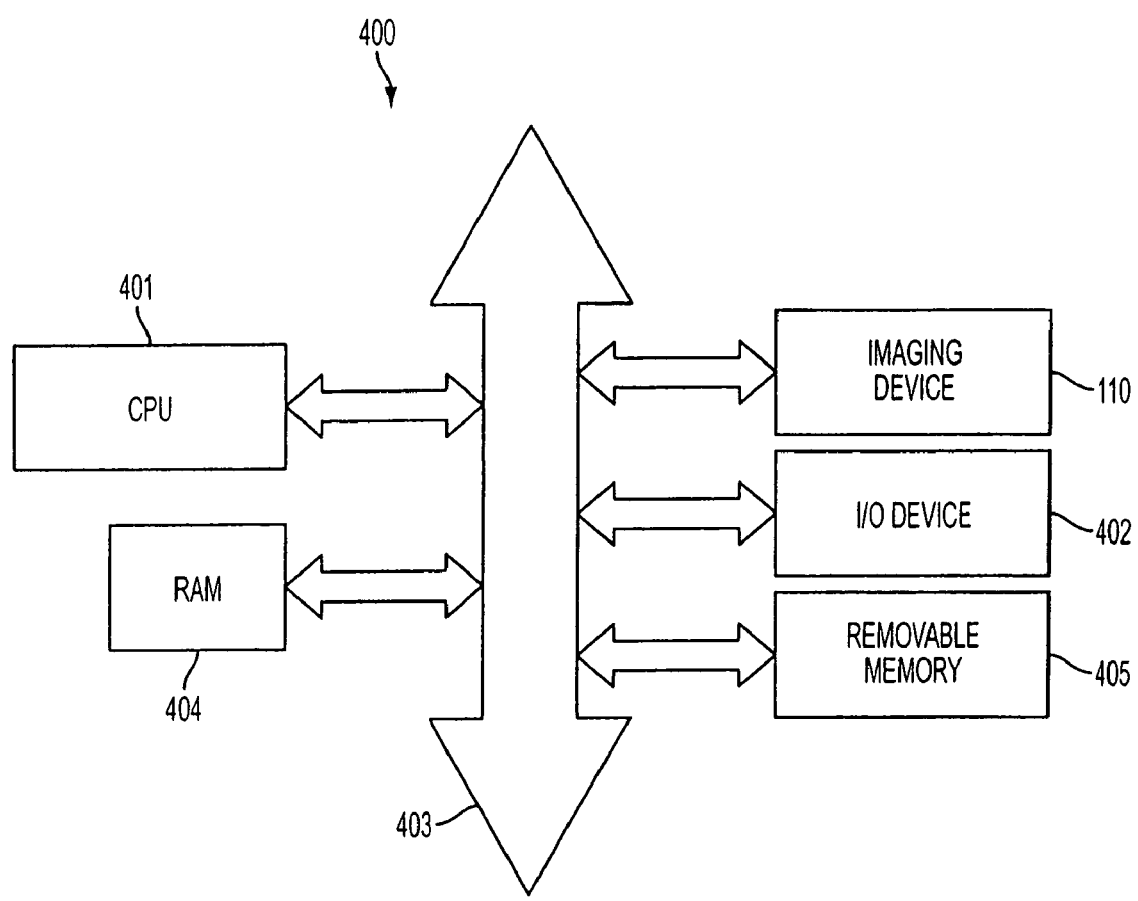
FIG. 6 is a block diagram for a processor system constructed in accordance with an exemplary embodiment of the invention.

FIG. 6 illustrates a processor system 400 including the image sensor 110 of FIG. 2 and employing the exemplary pixel array discussed with reference to FIG. 3. The processor-based system 400 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and other image sensing systems.

The processor system 400, for example a camera system, generally comprises a central processing unit (CPU) 401, such as a microprocessor, that communicates with an input/output (I/O) device 402 over a bus 403. Image sensor 400 also communicates with the CPU 401 over bus 403. The processor system 400 also includes random access memory (RAM) 404, and can include removable memory 405, such as flash memory, which also communicate with CPU 401 over the bus 403. Imaging device 110 may be combined with a processor, such as a CPU, digital signal processor, or microprocessor, with or without memory storage on a single integrated circuit or on a different chip than the processor. The processor system 400 may also be used for other purposes, such as in connection with a motion detection system.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. Any modification, though presently unforeseeable, of the present invention that comes within the spirit and scope of the following claims should be considered part of the present invention.

What is claimed as new and desired to be protected by Letters Patent of the United States is:

1. An imager comprising:
    a pixel array comprising:
        a plurality of pixels arranged in rows and columns, each of said pixels comprising a photosensor for generating charge in response to light and a transfer transistor for transferring said charge from said photosensor to an associated floating diffusing region; and
        first and second transfer transistor control lines associated with at least one row of pixels, at least one pixel in said at least one row having a transfer transistor gate connected to the first transfer transistor control line and a plurality of other pixels in said at least one row having respective transfer transistor gates connected to the second transfer transistor control line,
    a control circuit coupled to said first and second transfer transistor control lines for providing at least one first transfer control signal to said first transfer transistor control line during an integration period of said plurality of other pixels to transfer charges generated by said at least one pixel to an output circuit; and
    a light control circuit responsive to charges transferred to said output circuit for controlling a duration of said integration period of said plurality of other pixels,
    wherein said control circuit is configured to provide at least one second transfer control signal to the second transfer transistor control line at an end of said first integration period to transfer charges generated by the photosensors of said plurality of other pixels during said first integration period.

2. The imager of claim 1, wherein every row of said array comprises at least one pixel having a transfer transistor gate that is connected to a first transfer transistor control line of the row and a plurality of pixels having respective transfer transistor gates connected to a second transfer transistor control line of the row.

3. The imager of claim 1, wherein said first and second transfer transistor control lines are selectively connectable to one another.

4. The imager of claim 1, wherein said at least one pixel in said at least one row having a transfer transistor gate connected to the first transfer transistor control line further comprises:
at least one each of a red pixel, a blue pixel, and a green pixel.

5. The imager of claim 1, wherein the light control circuit provides a light control signal to said control circuit.

6. The imager of claim 5, wherein said light control circuit is arranged to provide said light control signal to said control circuit when a threshold is reached.

7. The imager of claim 1, wherein pixels in a plurality of rows contain transfer transistor gates connected to said first transfer transistor control line.

8. An imager comprising:
at least one first pixel and a plurality of second pixels located in a row of pixels, each of said first and second pixels comprising:
a photosensitive device;
a transistor for transferring charge from said photosensitive device to a storage region;
circuitry for reading out a signal from said storage region, the signal representing an amount of charge transferred to said storage region; and
a reset device for resetting said storage region while said transistor for transferring charge is switched off to hold said charge at said photosensitive device,
wherein said transistor in said at least one first pixel is constructed to receive at least one first transfer control signal over a first control line, and said transistor of each of said plurality of second pixels is constructed to receive a second transfer control signal over a second control line;
a control circuit for providing said at least one first control signal to said first control line during an image frame to output a signal; and
a light control circuit configured to control a duration of said image frame based on said signal.

9. The imager of claim 8, wherein said control circuit is configured to provide a second control signal over said second control line at an end of said image frame to output an image signal generated during said image frame.

10. The imager of claim 9, wherein said control circuit provides a plurality of first control signals to said first control line during said image frame.

11. The imager of claim 9, wherein said light control circuit is configured to trigger said control circuit to provide said second control signal when a threshold is reached.

12. The imager of claim 9, wherein said light control circuit is arranged to control an integration period for at least one of said plurality of second pixels.

13. The pixel array of claim 8, wherein said first and second control lines are selectively connectable to one another.

14. An imager comprising:
a pixel array comprising:
at least one first pixel and a plurality of second pixels located in a row of pixels, each of said first and second pixels comprising:
a photosensitive device;
a transistor for transferring charge from said photosensitive device to a storage region;
circuitry for reading out a signal from said storage region, the signal representing an amount of charge transferred to said storage region; and
a reset device for resetting said storage region while said transistor for transferring charge is switched off to hold said charge at said photosensitive device,
wherein said transistors for transferring charge in said first and second pixels are connected to respective first and second transfer control lines;
a control circuit for providing least one first control signal to said first transfer control line to output a signal from said at least one first pixel during an integration period of at least one of said second pixels; and
a light control circuit for controlling said integration period of said at least one second pixel based on said signal from said at least one first pixel.

15. The imager of claim 14, said control circuit further comprising one common row driver configured to provide said first and second transfer control signals.

16. The imager of claim 15, wherein said first transfer transistor control line is selectively connected to said row driver.

17. The imager of claim 14, said control circuit further comprising first and second row drivers configured to provide said respective first and second transfer control signals.

18. The imager of claim 17, wherein said first row driver is located on a side of said pixel array opposite said second row driver.

19. The imager of claim 14, said control circuit further comprising:
a circuit for determining when to provide said at least one first control signal.

20. The imager of claim 14, further comprising at least one memory element for storing respective digital signals representing signals output from said first and second pixels.

21. The imager of claim 14, wherein said light control circuit is configured to trigger said control circuit to provide said second control signal to said second transfer control line when a threshold is reached.

22. The imager of claim 14, wherein said signal output from said at least one first pixel during said integration period includes a plurality of signals output from said at least one first pixel.

23. A computer system comprising:
a processor; and
an imaging device connected to said processor and comprising:
a pixel array comprising a plurality of pixels for producing an image and being arranged in rows and columns, said plurality of pixels comprising at least one row of pixels associated with first and second transfer control lines,
wherein in said at least one row, at least one first pixel comprises a first transfer transistor gate that is connected to the first transfer control line and a plurality of said pixels have respective second transfer transistor gates connected to the second transfer control line, each of said first and second transfer transistors being configured to transfer photogenerated charge to an associated floating diffusion region;

a control circuit for providing at least one first control signal to said first transfer control line to output a signal from said at least one first pixel during an integration period of at least one of said second pixels; and a light control circuit for controlling said integration period of said at least one second pixel based on said signal from said at least one first pixel.

24. A method of operating a pixel array comprising:

applying a first control signal on a first transfer transistor control line to activate a first transfer transistor of a first pixel of a row during an integration period of a second pixel in the row, the first transfer transistor transferring charge to a charge storage region;

reading out a signal from said first pixel based on said charge transferred by said first transfer transistor;

using said readout signals from said first pixel to determine an end of the integration period of the second pixel; and applying a second control signal along a second transfer transistor control line to activate a second transfer transistor of the second pixel at the end of the integration period of the second pixel, the second transfer transistor transferring charge to a charge storage region, wherein said first control signal is applied along said first transfer transistor control line multiple times during said integration period.

25. The method of claim 24, further comprising reading out a signal from said first pixel multiple times during said integration period.

26. The method of claim 25, further comprising the act of storing said output pixel signals from said first pixel in at least one on-chip memory element.

27. A method of operating a pixel array comprising:

transferring first photo-charges from a first photosensor in a row of pixels in the array during a frame to generate a light control signal by applying a first transfer control signal on a first transfer transistor control line to transfer charge to a charge storage region; and transferring second photo-charges from a second photosensor in the row of pixels during the frame to generate a pixel image signal by applying a second transfer control signal on a second transfer transistor control line at a time determined according to the light control signal to transfer charge to a charge storage region, wherein said light control signal is output to an input of a light control circuit, wherein said light control circuit causes a readout of pixel image signals from a row of pixels in said array when a threshold is reached, and wherein said light control circuit determines when said threshold is reached by comparing at least one light control signal to said threshold.

28. The method of claim 27, wherein said light control signal is processed as an analog signal and compared to a trigger value.

29. The method of claim 27, wherein said light control signal is converted to a digital signal and stored in memory.

30. The method of claim 27, wherein said first pixel outputs more than one light control signal during an image frame.

31. The method of claim 27, further comprising selectively connecting said first and second transfer transistor control lines during another frame.

* * * * *

UNITED STATES PATENT AND TRADEMARK OFFICE
CERTIFICATE OF CORRECTION

PATENT NO. : 7,741,589 B2 Page 1 of 1
APPLICATION NO. : 11/417160
DATED : June 22, 2010
INVENTOR(S) : Jorgen Moholt et al.

It is certified that error appears in the above-identified patent and that said Letters Patent is hereby corrected as shown below:

In column 10, line 17, in Claim 14, delete "least" and insert -- at least --, therefor.

Signed and Sealed this

Seventeenth Day of August, 2010

David J. Kappos
*Director of the United States Patent and Trademark Office*